United States Patent [19]
Suzuki et al.

[11] Patent Number: 5,484,748
[45] Date of Patent: Jan. 16, 1996

[54] METHOD FOR STORAGE OF SILICON WAFER

[75] Inventors: Kuniyoshi Suzuki; Toshiaki Takaku, both of Fukushima, Japan

[73] Assignee: Shin-Etsu Handotai Co., Ltd., Tokyo, Japan

[21] Appl. No.: 393,424

[22] Filed: Feb. 23, 1995

[30] Foreign Application Priority Data

Mar. 25, 1994 [JP] Japan .................................. 6-079601

[51] Int. Cl.⁶ ................................................ H01L 21/302
[52] U.S. Cl. ......................... 437/225; 437/250; 437/946; 148/DIG. 17
[58] Field of Search .................................. 437/225, 250, 437/946; 148/DIG. 17, DIG. 127; 134/1.3, 2, 3

[56] References Cited

U.S. PATENT DOCUMENTS

| | | | |
|---|---|---|---|
| 3,383,319 | 5/1968 | Black | 134/1.3 |
| 5,081,068 | 1/1992 | Endo et al. | 437/946 |
| 5,294,570 | 3/1994 | Fleming et al. | 437/946 |
| 5,352,328 | 10/1994 | Obeng et al. | 437/225 |

FOREIGN PATENT DOCUMENTS 61-96738  5/1986  Japan .................................. 437/946

OTHER PUBLICATIONS

S. Wolf & R. N. Tauber, "Silicon Processing for the VLSI Era", 1986 vol. I, pp. 514–521, 531–535.

C. Okada, et al., Jpn. J. Appl. Phys., 32 (1993) L1031 "Accumulation of Organic Matter on Bare Si Wafer in Air".

M. Grunder, J. Vac. Sci. Technol., A5, 4 (1987) 2011 "HREELS Measurements on Hydrophilic Si (100) Wafers . . . ".

Primary Examiner—Brian E. Hearn
Assistant Examiner—Leon Radomsky
Attorney, Agent, or Firm—Ronald R. Snider

[57] ABSTRACT

The single crystal silicon wafers which have undergone a treatment with a chemical liquid such as an acid or an alkali are stored without entailing contamination of their surfaces by causing the wafers to be immediately immersed, either directly or after being washed with water, in an aqueous hydrogen peroxide solution. The prevention of the contamination of surfaces of the wafers is attained effectively by setting the concentration of hydrogen peroxide in the aqueous hydrogen peroxide solution in the range of from 0.01 to 30% by weight and the temperature of the aqueous hydrogen peroxide solution at the time that the wafers are immersed in the solution in the range of from 10° to 30° C.

6 Claims, 1 Drawing Sheet

5,484,748

METHOD FOR STORAGE OF SILICON WAFER

BACKGROUND OF THE INVENTION

1. Field of the Invention:

This invention relates to a method for temporary storage of wafers made of silicon (hereinafter referred to as "wafer") in the process of production. More particularly, this invention relates to a method for enabling wafers in process to be stored between the component processes without exposing the surfaces thereof to contaminant, in the fabrication of mirror wafers by the treatment of wafers cut from a single crystal silicon rod in various sequential processes.

2. Description of the Prior Art:

In the fabrication of mirror wafers from wafers cut from a single crystal silicon rod, the said wafers are generally treated in the processes of chamfering, lapping, washing, etching, prewashing for annealing, and annealing in the order mentioned and thereafter polished until mirror finish.

When the treatment includes an additional process of sandblasting, the process is interposed between the etching and the annealing process mentioned above and the annealing process is followed by a washing after sandblating and a prewashing for annealing.

The workshop engaging in the manufacture of wafers is at times compelled to put wafers in process to protracted storage between the component processes mentioned above to suit the convenience of the job system. At a factory operated on the five-day week system, for example, the durations of such storage possibly totals about 60 hours.

Heretofore, in the lapping through the annealing process mentioned above, this protracted storage has inevitably exposed the surfaces of wafers to contaminant as specifically described hereinbelow in spite of very severe control of the conditions of the storage. For this reason, restrictions have been frequently imposed on the pertinent processes possibly to the extent of rendering difficult the improvement of the operation rate of the plant or the productivity of the operation.

To shorten the storage time, it becomes necessary for the workshop to install a fairly large sum of facilities and arrange workers for attending such facilities or adopt a 24-hour day 7-day week job system or it becomes inevitable for the workers to suffer the burden of the waiting times (which are necessary for shortening the storage time of wafers ) between the component processes of the treatment of wafers. Further, the fact that the ratio of the waiting time to the working time cannot be ignored entails the problem that the job system is rationalized only with difficulty.

Here, various sorts of contaminant which occur on the surfaces of wafers will be described. The wafers in process are washed before and after each process, then either immersed in purified water or dried, and stored as placed in an atmosphere of clean dry air (degree of cleanliness 100 or over) at normal room temperature. In spite of all these efforts, the surfaces of wafers yield to the sorts of contaminant which are shown in Table 1 below.

TABLE 1

| Etching/washing process (with liquid) | Conditions of storage | Start of contamination | Pattern of surface contamination |
|---|---|---|---|
| After etching | Purified water | After 30 minutes | contamination like aurora |
| After post-washing of etching | Clean dry air | After 8 hours | contamination in bluish white color |
| After post-washing of sandblasting | Clean dry air | After 8 hours | contamination in bluish white color |
| After pre-washinng for annealing | Clean dry air | After 5 minutes | Basket contamination |

In Table 1, the ratings of surface contamination are obtained visually under a focusing lamp. To be specific, in the parts sustaining "contamination like aurora" and "basket contamination", the occurrence of coarse surface, protrusions, and pits was confirmed. It is inferred that these surface defects were caused by fine etching with residual corrosive chemical liquids. The "contamination in bluish white color" was such contamination as expanded in the form of a strip in the outer through the outer peripheral part of a given wafer. It is inferred that this contamination was caused by not only the action of the chemical liquids mentioned above but also the conditions of the atmosphere (temperature and humidity) used for the storage. The "basket contamination" was such contamination as occurred in the parts where the ribs of a basket used for storing and conveying wafers contacted with the wafers. Though the cause therefore remains yet to be elucidated, it is inferred that this contamination was caused by the chemical liquids which persisted at the sites of the contact mentioned above.

Of the various chemical liquids which are usable in the processes of treatment indicated in Table 1, that which is usable in the processes of etching is either the aqueous solution of hydrofluoric acid, a mixed acid of hydrofluoric acid and nitric acid, or a mixed acid of these two acids plus acetic acid or the aqueous solution of caustic soda or caustic potash, for example.

The chemical liquid which is usable in the processes of washing is the aqueous solution of such an acid as hydrofluoric acid, hydrochloric acid, or citric acid or the aqueous solution of such an alkali as caustic soda, caustic potash, or ammonia, optionally additionally containing therein a small amount of hydrogen peroxide or a surfactant.

Even when the washing with purified water is repeated again, the wafers already dried are stored in their unmodified form in a clean bench filled with highly clean atmosphere, or the wafers washed with purified water are stored in their unmodified form in purified water on the assumption that the contamination of surfaces of wafers are caused by the aforementioned chemical liquids which are not perfectly removed by the subsequent washing with purified water or by drying or by contaminant remaining in the atmosphere used for the storage of wafers, the contamination caused on the surfaces of waters after the elapse of a certain length of time can not be perfectly removed.

Though the aforementioned repetition of the washing with purified water is recognized to be veritably effective in decreasing the frequency of the contamination of surfaces of wafers, this method entails extra time and labor and nevertheless offers no decisive solution to the problem of contamination.

BRIEF DESCRIPTION OF THE DRAWING

The invention will be better understood and the objects and features thereof other than those set forth above will become apparent when consideration is given to the following detailed description thereof, which makes reference to the annexed drawing.

SUMMARY OF THE INVENTION

Figure 1:
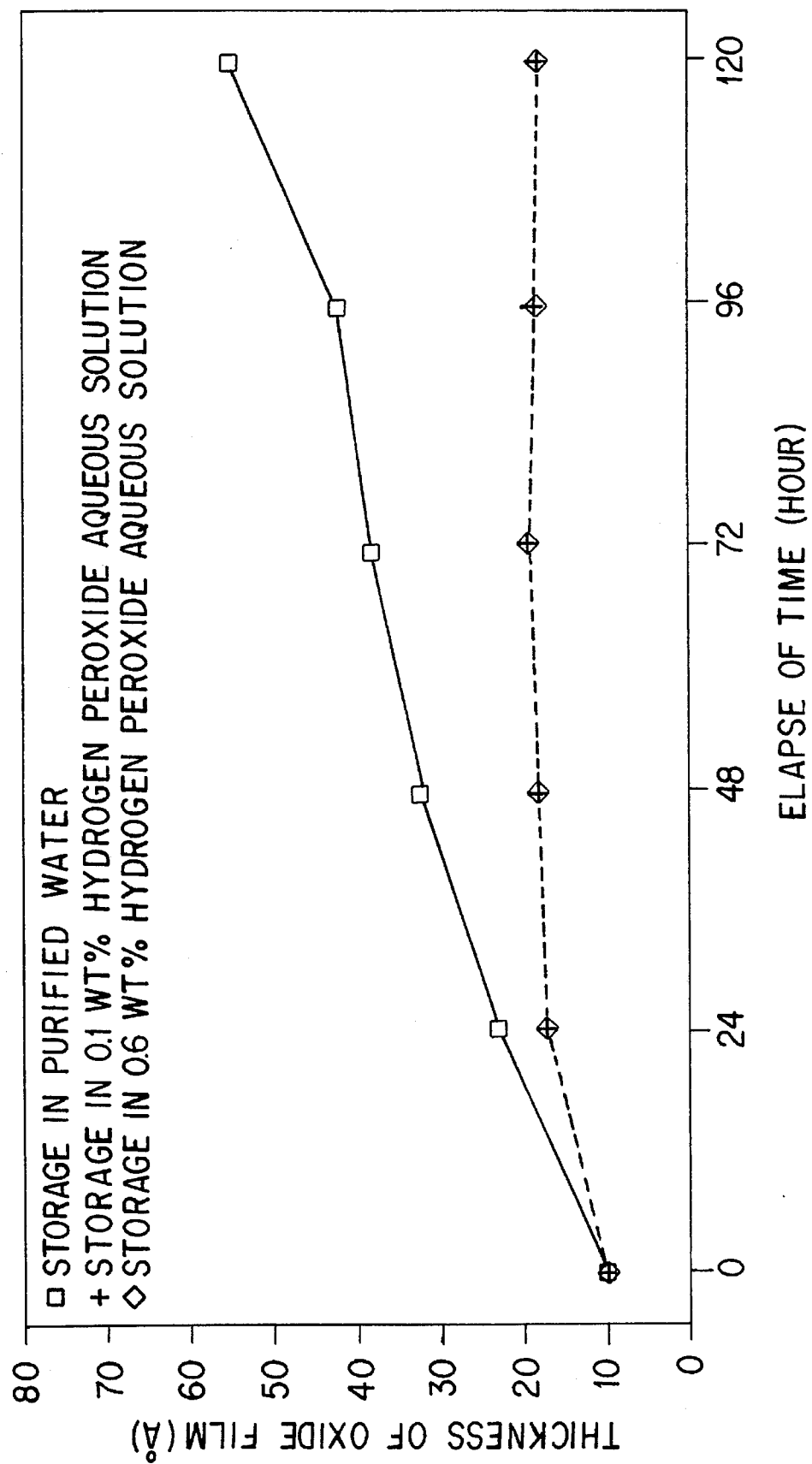
FIG. 1 is a graph showing the results of a test storage of silicon wafers performed by the method of this invention and the conventional method.

This invention has been produced in association with such problems attendant on the prior art as described above. An object of this invention is to provide a method for the storage of wafers in process, which method, for the purpose of preventing the contamination of surfaces of wafers which frequently occurs particularly during the storage of wafers after the treatment with a chemical liquid among other processes for the production of wafers, adopts a relatively simple measure of temporarily storing the wafers in an aqueous hydrogen peroxide solution instead of the conventional measure of temporarily storing them in purified water or storing them in a clean dry air.

The first aspect of this invention recites a method for the storage of silicon wafers, which is characterized by causing silicon wafers which have undergone a treatment with such a chemical liquid as an acid or an alkali to be immediately immersed, either directly or after being washed with water, in an aqueous hydrogen peroxide solution.

The second aspect of this invention recites a method for the storage of silicon wafers according to the first aspect of this invention, wherein the concentration of hydrogen peroxide in the aqueous hydrogen peroxide solution is in the range of from 0.01 to 30% by weight, preferably from 0.05 to 1% by weight, and the temperature of the aqueous hydrogen peroxide solution at the time that the single crystal silicon wafers are immersed therein is in the range of from 0° C. to 80° C., preferably from 10° C. to 30 ° C.

The third aspect of this invention recites a method for the storage of silicon wafers according to the said first or second aspect of this invention, wherein the chemical liquid is an etching liquid or a liquid etching detergent, i.e. the aqueous solution of one member or two members or more selected from the group consisting of an inorganic acid such as hydrofluoric acid, hydrochloric acid, or nitric acid or an organic acid such as acetic acid or citric acid.

The fourth aspect of this invention recites a method for the storage of silicon wafers according to the said first or second aspect of this invention, wherein the chemical liquid is an etching liquid or a liquid etching detergent, i.e. the aqueous solution of one member or two members selected from the group consisting of caustic soda, caustic potash, and ammonia.

DESCRIPTION OF THE PREFERRED EMBODIMENTS

The prevention of the occurrence of contamination of the surfaces of wafers by the present invention (methods of storage according to the first to the fourth aspect of this invention) may be logically explained by an inference that the chemical liquids remaining on the wafers are dissolved in the aqueous hydrogen peroxide solution and dispersed to extremely small concentrations therein and, at the same time, the etching action of the chemical liquids exerted on the wafer surfaces is obstructed in some form or other by the hydrogen peroxide.

In the present invention, the concentration of hydrogen peroxide in the aqueous hydrogen peroxide solution and the temperature of the aqueous hydrogen peroxide solution at the time that the wafers are immersed in the solution are limited for the following reasons.

If the concentration of hydrogen peroxide is less than 0.01% by weight, the contamination of surfaces of wafers is not prevented fully effectively. If it exceeds 30% by weight, the solution used for the storage will prove to be disadvantageous in terms of cost and personal safety on the part of workers, though the prevention itself may be obtained effectively.

If the temperature of the aqueous hydrogen peroxide solution is less than 0° C., the solution will be frozen and will no longer suit the purpose of storage. Conversely, if it exceeds 80° C., the solution will no longer suit the purpose of protracted storage, will incur extra cost of equipment, and will jeopardize personal safety on the part of workers because hydrogen peroxide undergoes vigorous decomposition and inflicts damage on the surfaces of wafers.

More desirably from the practical point of view, the concentration of hydrogen peroxide is in the range of from 0.05 wt % to 1 wt % and the temperature of the aqueous hydrogen peroxide solution at the time of the immersion of wafers is in the range of from 10° C. to 30° C.

Now, this invention will be described specifically below with reference to working examples.

From green wafers cut from a single crystal silicon rod which had been pulled by the Czochralski method, sandblasted wafers were prepared by subjecting the green wafers sequentially to the processes of lapping, washing after lapping, chamfering, etching, washing after etching, sandblasting, washing after sandblasting, prewashing for annealing, and annealing in the order mentioned. The wafers which had been treated with the following three kinds of chemical liquids were tested for manner of storage.

The wafers which had undergone etching with an etching liquid formed of a mixed acid system of Example 1 (hydrofluoric acid+nitric acid+acetic acid+water), the wafers which had undergone washing after etching with a washing liquid of Example 2 (ammonia+hydrogen peroxide+water), and the wafers which had undergone washing after sandblasting with a washing liquid of Example 3 (hydrofluoric acid+water) were stored by the method of this invention and the conventional method and the surfaces of the stored wafers were visually examined as to the extent of contamination.

In this case, for the method of this invention, three species of aqueous hydrogen peroxide solutions of relatively low concentration were prepared by mixing an aqueous hydrogen peroxide solution with a product assay of 30 wt % and purified water. For the conventional method, purified water containing no hydrogen peroxide was used. The durations of storage in which the surfaces of wafers were not defiled are shown in Table 2.

TABLE 2

| | $H_2O_2$ concentration in liquid for storage | Etching liquid of $HF.HNO_3.CH_3COOH.H_2O$ of Example 1 | | Washing liquid of $NH_4OH.H_2O_2.H_2O$ of Example 2 | | Washing liquid of $HF.H_2O$ of Example 3 | |
|---|---|---|---|---|---|---|---|
| | | n | Duration of storage | n | Duration of storage | n | Duration of storage |
| Conventional method | Zero | 250 | 30 minutes | 250 | 12 to 80 hours | 250 | 2 to 88 hours |
| Method of the invention | 0.06 wt % | 50 | 120 hours | 50 | 120 hours | 50 | 120 hours |
| | 0.59 wt % | 50 | 120 hours | 50 | 120 hours | 75 | 120 hours |
| | 2.73 wt % | 75 | 120 hours | 50 | 120 hours | 100 | 120 hours |

(The symbol "n" in Table 2 stands for number of wafers subjected to the test.

In Table 2, the "$H_2O_2$, concentration—zero," namely the sole use of purified water, concerns the conventional method and the "$H_2O_2$ concentrations 0.06 wt % to 2.73 wt %" concern the methods of this invention. It is clearly remarked from Table 2 that in the storage effected by the method of this invention after (1) the process of etching, (2) the process of washing after etching, and (3) the process of washing after sandblasting, the contamination heretofore observed on wafer surfaces did not occur within at least 120 hours of start of the storage. In the storage using a bath solely of purified water according to the conventional method, the same contamination as heretofore observed occurred after the elapse of 30 minutes in an early case and after the elapse of 88 hours in a late case. The mixed liquid having a $H_2O_2$, concentration of 0.06 wt % was prepared by mixing an aqueous hydrogen peroxide solution with a product assay of 30 wt % with purified water at a weight ratio of 1:500.

Test Example

In this invention, the mechanism which causes the aqueous hydrogen peroxide solution to provide effective prevention of wafers from contamination has not yet been elucidated.

The following test, therefore, was carried out for the purpose of finding differences between the conventional method and this invention. The conventional method stored wafers in a bath formed solely of purified water and the method of this invention stored wafers in two aqueous solutions containing $H_2O_2$ at respective concentrations of 0.1 wt % and 0.6 wt %.

When wafers which had undergone the same washing process after sandblasting as in Example 3 were stored for a total duration of 120 hours and, at intervals of 24 hours meanwhile, were visually examined to determine the thickness of an oxide film formed on the wafer surfaces. The results were as shown in FIG. 1. The thickness of the oxide film was measured by the infrared total reflection damping method.

It is noted from FIG. 1 that while the oxide film ($SiO_2$ film) formed during the storage in purified water according to the conventional method grew unstably with the elapse of time, the oxide films formed during the storage in the two aqueous solutions having hydrogen peroxide concentrations of 0.1 wt % and 0.6 wt % according to this invention showed an identical trend and grew stably to a fixed thickness in the approximate range of from 17 to 18 Å. From the results, it can be safely inferred that a quantitative difference of some sort exists between the conventional method and the present invention. FIG. 1, however, offers no definite solution to the question whether or not the growth of the oxide film in the case of the conventional method was observed in the form of contamination of wafers or to the question whether or not the oxide film of a stable thickness formed in the initial stage of storage observed in the case of this invention functioned as a protective coating against a chemical liquid. The wafers stored in purified water began to be contaminated within about 40 hours, whereas the wafers stored in aqueous hydrogen peroxide solution were not contaminated at all even after the elapse of 120 hours.

As is clear from the description given thus far, the method of this invention is characterized by causing silicon wafers which have undergone a treatment with such a chemical liquid as an acid or an alkali to be immediately immersed, either directly or after being washed with water, in an aqueous hydrogen peroxide solution. Since this invention enables wafers to be stored without inducing defilement of their surfaces for such a long time as about 120 hours (about five days), it is effective in solving various problems due to the necessity for shortening the durations of storage between the component processes for the production of wafers and exalting markedly the operational efficiency of the production of wafers.

Further, this invention notably heightens the effect of storage by a simple method of setting the concentration of hydrogen peroxide in the aqueous hydrogen peroxide solution in the range of from 0.05 to 1 wt % and the temperature of the aqueous hydrogen peroxide solution at the time of immersion of wafers therein in the range of from 10° to 30° C.

What is claimed is:

1. A method for the storage of silicon wafers, which is characterized by causing silicon wafers which have undergone a treatment with such a chemical liquid as an acid or an alkali solution to be immediately immersed, either directly or after being washed with water, in an aqueous hydrogen peroxide solution, and storing said silicon wafers therein until the next component process.

2. A method according to claim 1, wherein the concentration of hydrogen peroxide in said aqueous hydrogen peroxide solution is in the range of from 0.01 to 30% by weight, preferably from 0.05 to 1% by weight, and the temperature of said aqueous hydrogen peroxide solution at the time that single crystal silicon wafers are immersed therein is in the range of from 0° C. to 80° C., preferably from 10° C. to 30° C.

3. A method according to claim 1, wherein said chemical liquid is an etching liquid or a liquid etching detergent, comprising the aqueous solution of one or more members selected from the group consisting of an inorganic acid such as hydrofluoric acid, hydrochloric acid, or nitric acid or an organic acid such as acetic acid or citric acid.

4. A method according to claim 1, wherein said chemical liquid is an etching liquid or a liquid etching detergent, comprising the aqueous solution of one member or two members selected from the group consisting of caustic soda, caustic potash, and ammonia.

5. A method according to claim 2, wherein said chemical liquid is an etching liquid or a liquid etching detergent, comprising the aqueous solution of one or more members selected from the group consisting of an inorganic acid such as hydrofluoric acid, hydrochloric acid, or nitric acid, or an organic acid such as acetic acid or citric acid.

6. A method according to claim 2, wherein said chemical liquid is an etching liquid or a liquid etching detergent, comprising the aqueous solution of one or two members selected from the group consisting of caustic soda, caustic potash, and ammonia.

* * * * *